US005338944A

United States Patent [19]

Edmond et al.

[11] Patent Number: 5,338,944
[45] Date of Patent: Aug. 16, 1994

[54] BLUE LIGHT-EMITTING DIODE WITH DEGENERATE JUNCTION STRUCTURE

[75] Inventors: John A. Edmond, Apex; Hua-Shuang Kong, Raleigh; Vladimir Dmitriev, Fuquay-Varina; Gary E. Bulman, Cary, all of N.C.

[73] Assignee: Cree Research, Inc., Durham, N.C.

[21] Appl. No.: 125,284

[22] Filed: Sep. 22, 1993

[51] Int. Cl.$^5$ .............................................. H01L 33/00
[52] U.S. Cl. ......................................... 257/76; 257/77; 257/101; 257/102; 257/103
[58] Field of Search ................... 257/76, 77, 101, 102, 257/103

[56] References Cited

U.S. PATENT DOCUMENTS

| | | | |
|---|---|---|---|
| 3,864,721 | 2/1975 | Cohen | 357/17 |
| 4,165,515 | 8/1979 | Bergman, Jr. et al. | 357/6 |
| 4,179,702 | 12/1979 | Lamorte | 357/30 |
| 4,720,642 | 1/1988 | Marks | 307/150 |
| 4,918,497 | 4/1990 | Edmond | 257/77 |
| 5,027,168 | 6/1991 | Edmond | 257/77 X |
| 5,061,972 | 10/1991 | Edmond | 257/77 |
| 5,079,601 | 1/1992 | Esaki et al. | 357/4 |
| 5,166,761 | 11/1992 | Olson et al. | 257/46 |
| 5,237,581 | 8/1993 | Asada et al. | 372/45 |
| 5,243,204 | 9/1993 | Suzuki et al. | 257/77 |

FOREIGN PATENT DOCUMENTS

| | | |
|---|---|---|
| 63-128680 | 6/1988 | Japan . |
| 63-133682 | 6/1988 | Japan . |
| 1106476 | 4/1989 | Japan . |
| 4-67689 | 3/1992 | Japan . |
| 4-120775 | 4/1992 | Japan . |

OTHER PUBLICATIONS

C. R. Lewis, et al., *The Growth of Magnesium-Doped GaAs by the OM-VPE Process*, Journal of Electronic Materials, vol. 12, No. 3, 1983, pp. 507-524.

N. Holonyak, Jr. and I. A. Lesk, *Gallium Arsenide Tunnel Diodes*, Proceedings of the IRE, vol. 48, No. 8, Aug. 1960, pp. 1405-1409.

Sukekatsu Ushioda, et al., *Grating-Coupled Light Emission from Slow Mode of Metal-Insulator-Metal Tunnel Junctions*, Jpn. J. Appl. Phys., vol. 31, Pt. 2, No. 7A, 1992, pp. L870-L873.

R. D. Dupuis, et al., *Stacked Multiple-Bandgap Solar Cells Prepared by CVD Techniques*, Fourteenth IEEE Photovoltaic Specialists Conference, 1980, pp. 1388-1389.

A. R. Sugg, et al., "n-p-(p$^+$-n$^+$)-n Al$_y$Ga$_{1-y}$As-GaAs-In$_x$Ga$_{1-x}$As quantum—well laser with p$^+$-n$^+$ GaAs-InGaAs tunnel contact on n-GaAs," Appl. Phys. Lett., vol. 62, No. 20, May 1993, pp. 2510-2512.

J. M. Dallesasse and N. Holonyak, Jr., "Native-oxide stripe-geometry Al$_x$Ga$_{1-x}$As-GaAs quantum well heterostructure lasers," Appl. Phys. Lett., vol. 58, No. 4, Jan. 1991, pp. 394-396.

*Primary Examiner*—William Mintel
*Attorney, Agent, or Firm*—Bell, Seltzer, Park & Gibson

[57] ABSTRACT

A light emitting diode is disclosed that emits light in the blue region of the visible spectrum with increased brightness and efficiency. The light emitting diode comprises an n-type silicon carbide substrate; an n-type silicon carbide top layer; and a light emitting p-n junction structure between the n-type substrate and the n-type top layer. The p-n junction structure is formed of respective portions of n-type silicon carbide and p-type silicon carbide. The diode further includes means between the n-type top layer and the n-type substrate for coupling the n-type top layer to the light-emitting p-n junction structure while preventing n-p-n behavior between the n-type top layer, the p-type layer in the junction structure, and the n-type substrate.

47 Claims, 2 Drawing Sheets

BLUE LIGHT-EMITTING DIODE WITH DEGENERATE JUNCTION STRUCTURE

FIELD OF THE INVENTION

The present invention relates to light-emitting diodes formed in semiconductor materials, and in particular relates to an LED with improved efficiency and brightness that is formed of silicon carbide and that emits visible light in the blue portion of the spectrum.

BACKGROUND OF THE INVENTION

A light-emitting diode (LED) is a widely used semiconductor device whose main characteristic is that it will emit energy in the form of light, usually within the visible spectrum, when a current flows through the device. The basic mechanisms by which light-emitting diodes operate are well understood in this art and are set forth, for example, by Sze, *Physics of Semiconductor Devices*, 2d Edition (1981) at pages 681-703. Silicon carbide-based LEDs are described in U.S. Pat. Nos. 4,918,497 and 5,027,168, both of which are assigned to the assignee of the present invention and incorporated entirely herein by reference. Co-pending and commonly assigned application Ser. No. 08/081,668 filed Jun. 23, 1993 for "*Blue Light-Emitting Diode with High External Quantum Efficiency*" also sets forth exemplary information about such devices.

As is well known to those familiar with semiconductor devices, light-emitting diodes, and the interactions between light and matter, the wavelength of light (i.e., its color) that can be emitted by a given material from which a light-emitting diode is formed, is limited by the physical characteristics of that material, specifically its bandgap. The bandgap in a semiconductor material represents the amount of energy that separates a lower energy valence band and a higher energy conduction band in which carriers (electrons or holes) can reside in accordance with well-known principles of quantum mechanics. When electrons and holes travel across the bandgap and recombine, they will, under certain circumstances, emit energy in the form of light. Biasing a semiconductor p-n junction to produce a current flow is one way to obtain such recombinations and the visible light they emit. Because the wavelength of light is inversely proportional to its frequency, and its frequency is directly proportional to the corresponding energy transaction, certain wavelengths of light cannot be obtained in materials that have relatively narrow bandgaps. For example, blue light is generally considered to be that visible light which is emitted in the 400-500 nanometer (nm) portion of the visible spectrum. It will be understood that 400-500 nm is a somewhat arbitrary range, and that wavelengths close to 400 nm are also considered to be violet, and those close to 500 nm to be green. Such wavelengths require energy transactions of at least 2.6 electron volts (eV) which means that light-emitting diodes that will emit blue light must be formed of materials that have a bandgap of at least 2.6 eV. Such materials include, in certain circumstances, zinc selenide (ZeSe), gallium nitride (GAN), diamond, and silicon carbide (SiC).

The desirable theoretical characteristics of silicon carbide, and its potential as a source material for blue LEDs, have been well understood for a number of decades, dating back almost to the beginning of the semiconductor era. Nevertheless, the difficulties of working with silicon carbide have precluded most researchers from producing commercially successful devices from it. For example, the author of the article "*Whatever Happened to Silicon Carbides?*", IEEE Transactions on Industrial Electronics, Volume IE-29, No. 2, May, 1982, basically concluded that although silicon carbide was a theoretically interesting material, "I see no viable market for SiC semiconductor devices in the near future."

Silicon carbide has a number of attractive features from an electronic standpoint. It has a high saturated electron-drift velocity, a wide bandgap, a high thermal conductivity, a high breakdown electric field, and is "hard" to radiation. Silicon carbide presents difficulties, however, because it can crystalize in over 150 polytypes, many of which are separated by very small thermodynamic differences. As a result, and as well known to those familiar with crystal growth techniques of semiconductors and other materials, obtaining the necessary pure single crystals of silicon carbide, and the typical epitaxial or implanted layers that are generally desired or required in many semiconductor device structures, has long been a difficult task.

In recent years, however, the assignees of the present invention have made significant progress in taming the process difficulties presented by silicon carbide and in taking advantage of its desirable characteristics. These include success in the areas of sublimation growth of single crystals (e.g., U.S. Pat. No. 4,866,005); growth of epitaxial layers of silicon carbide on single crystals (U.S. Pat. Nos. 4,912,063 and 4,912,064); implantation and activation of dopants into silicon carbide (U.S. Pat. No. 5,087,576); and etching techniques for silicon carbide (U.S. Pat. Nos. 4,865,685 and 4,981,551).

Building upon these successes, the assignees of the present invention have produced the first commercially viable blue light-emitting diodes in significant commercial quantities at reasonable prices. Such LEDs are thoroughly described in U.S. Pat. Nos. 4,918,497 and 5,027,168 which, as noted above, are incorporated entirely herein by reference.

Because an LED is a diode structure (i.e., a p-n junction), commercial LEDs formed from silicon carbide generally include an n-type substrate and terminate in a p-type epitaxial layer, or alternatively, incorporate a p-type substrate and terminate in an n-type layer. The characteristics of silicon carbide, however, are such that the n-type of silicon carbide is somewhat easier to dope, is more transparent when doped, and, as is usually the case with n-type semiconductors, has a greater conductivity than p-type silicon carbide. Accordingly, the use of n-type silicon carbide layers wherever possible affords greater electrical conductivity (lower resistance) and optical transparency with resulting increases in light emission, efficiency, and current spreading for LED structures made therefrom.

To date, however, the art has lacked a technique for maximizing the use of n-type silicon carbide in p-n junction LEDs. For example, although the nature of n-type silicon carbide is such that it would be advantageous to use it for both a substrate and a top layer of an LED, the presence of a p-n junction between two n-type layers would essentially result in an n-p-n structure; i.e., a bipolar junction transistor. As is known to those of ordinary skill in this art, a transistor functions quite differently from an LED and thus such a structure has to date remained impractical and undesirable.

OBJECT AND SUMMARY OF THE INVENTION

It is therefore an object of the present invention to provide a LED structure in silicon carbide that will emit light in the blue portion of the visible spectrum and that will do so while maximizing the use of n-type silicon carbide to take advantage of its higher conductivity, greater current spreading, and resulting increased brightness in an LED formed from it.

The invention meets this object with a structure that comprises an n-type silicon carbide substrate and an n-type silicon carbide top layer. A light-emitting p-n junction structure is positioned between the n-type substrate and the n-type top layer, with the p-n junction being formed of respective portions of n-type silicon carbide and p-type silicon carbide. The structure includes means between the n-type top layer and the n-type substrate for coupling the n-type top layer and the n-type substrate to the light-emitting p-n junction structure while preventing n-p-n behavior between the n-type top layer, the p-type layer in the junction, and the n-type substrate.

The foregoing and other advantages and objects of the invention will be understood more clearly in conjunction with the accompanying drawings which illustrate preferred and exemplary embodiments and wherein:

DETAILED DESCRIPTION

The present invention is a light-emitting diode that emits light in the blue region of the visible spectrum with increased brightness and efficiency. It will be understood, however, that the structure disclosed herein would apply to LEDs formed in silicon carbide or other difficult materials for which n-type substrates and top layers (or p-type substrates and p-type top layers) are both desired that would emit light in other portions of the spectrum; for example, ultraviolet, infrared, or colors other than blue within the visible spectrum. Because silicon carbide is particularly desired for its blue light-emitting potential, however, the remainder of the description will be carried out in terms of a blue LED.

Figure 1:
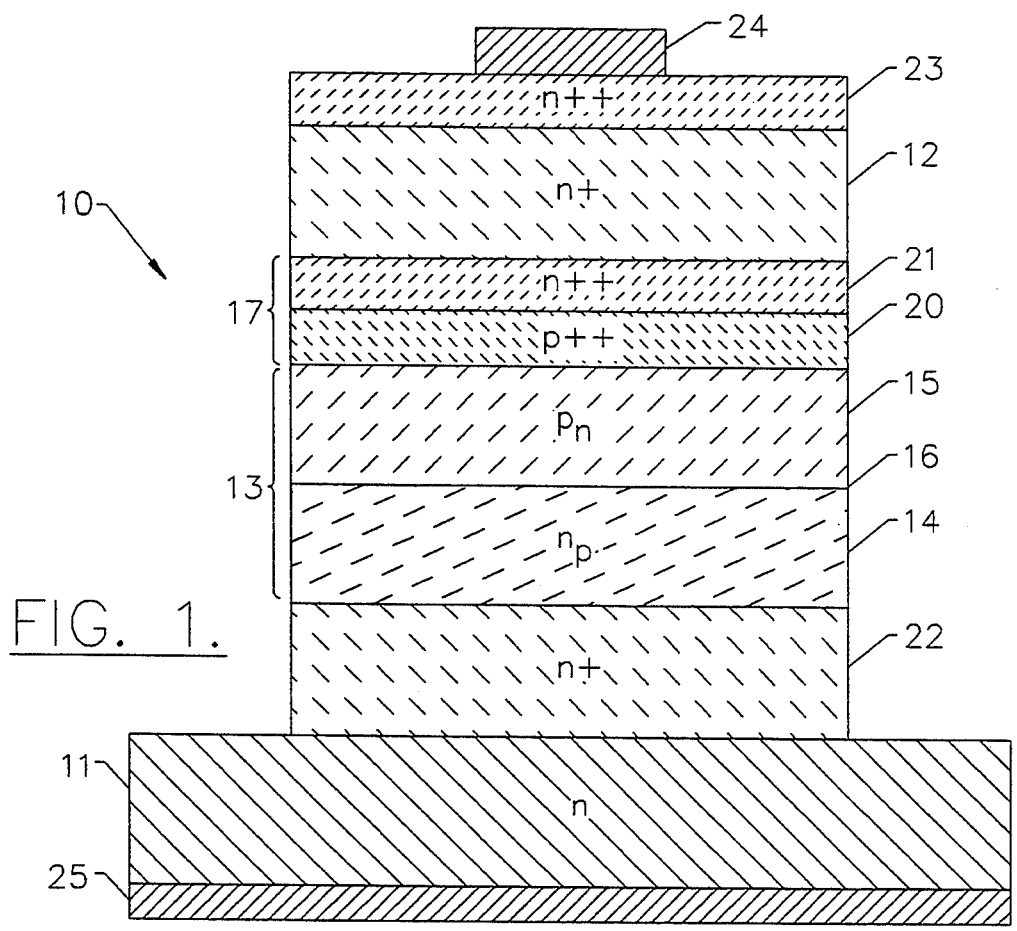
FIG. 1 is a cross-sectional schematic view of a first embodiment of a LED according to the present invention.

FIG. 1 illustrates an LED according to the invention and broadly designated at 10. The LED 10 includes an n-type silicon carbide substrate 11 and an n-type silicon carbide top layer 12. A light-emitting p-n junction structure broadly designated at 13 is between the n-type substrate 11 and the n-type top layer 12. The p-n junction is formed of respective portions of n-type silicon carbide 14 and p-type silicon carbide 15. These two layers form a p-n junction designated at 16.

At this point, it will be understood that if there were no other structural elements to the LED, the n-type top layer would necessarily be in contact with the p-type layer of the light-emitting junction structure and the overall structure would form an n-p-n bipolar junction transistor in undesirable fashion. Thus, in order to prevent such characteristics from being produced by the LED, the structure includes means between the n-type top layer 12 and the n-type substrate 11 for coupling the n-type top layer to the p-n junction structure 13 while preventing n-p-n behavior between the n-type top layer 12, the p-type layer in the junction structure 13 and the n-type substrate 11.

In the preferred embodiment, the coupling means comprises a degenerate junction structure designated at 17. The degenerate junction structure is also formed of a p-type portion 20 and an n-type portion 21 of silicon carbide and with the p-type portion of the degenerate junction structure 17 being adjacent to p-type layer 15 of silicon carbide in the junction structure As used herein, the term "degenerate" has its ordinary meaning; i.e., a semiconductor material which has been extremely heavily doped with desirable impurities to give it a certain type of conductive character; i.e., a character which is more in the nature of a conductor than a semiconductor. The term "degenerate" is not used in a limiting fashion, however, and as will be seen from the discussion which follows, it is the functional characteristics which define the structure rather than any particular nomenclature. In some circumstances, a degenerate junction is alternatively referred to as a tunnel junction or a tunnel diode, but again, this definition is not limiting of the present invention. In the degenerate junction structure 17, the doping in the n-type portion 21 and the p-type portion 20 is sufficiently heavy to minimize or effectively eliminate the depletion region barrier that would otherwise exist between the p-type portion and the n-type portion in the degenerate junction structure 17. Another way of describing the electronic characteristic is to say that the doping is sufficiently heavy to substantially (essentially) eliminate the barrier between the p-type portion 20 and the n-type portion 21 of the silicon carbide from which the portions are formed.

Thus, although the inventors do not wish to be bound by any particular theory of the invention, it is believed that the descriptions herein are the most accurate way of describing the structure and its functional characteristics.

Figure 2:
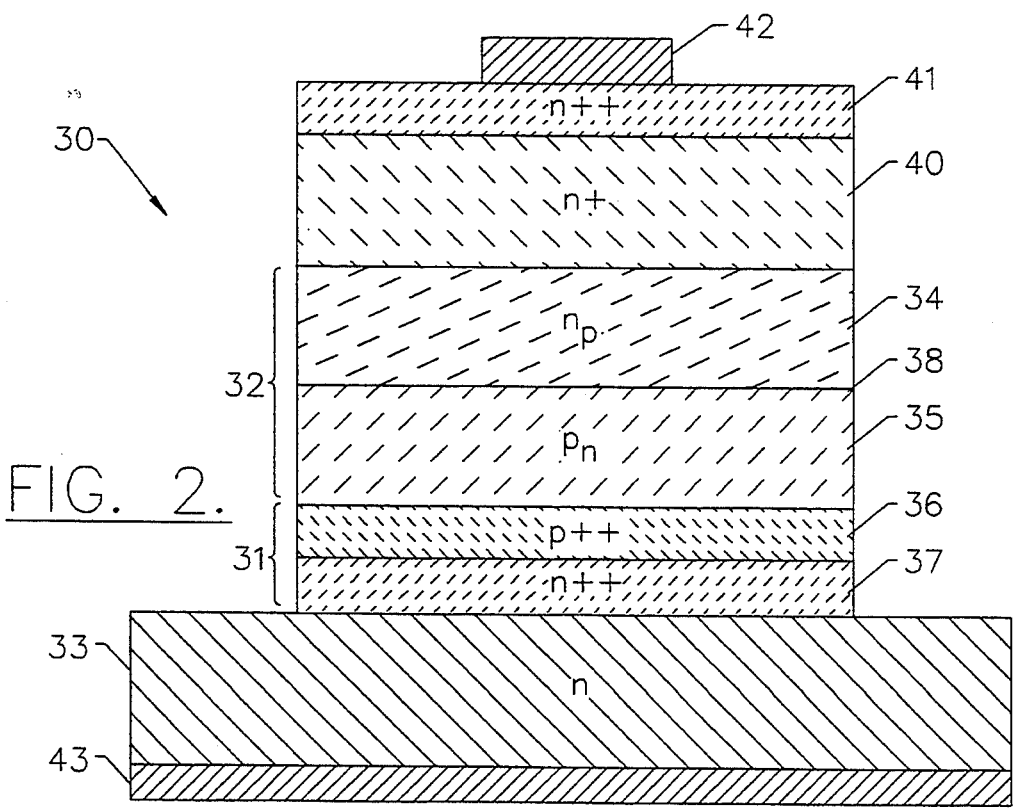
FIG. 2 is a similar structure of a second embodiment of an LED according to the present invention.
Figure 3:
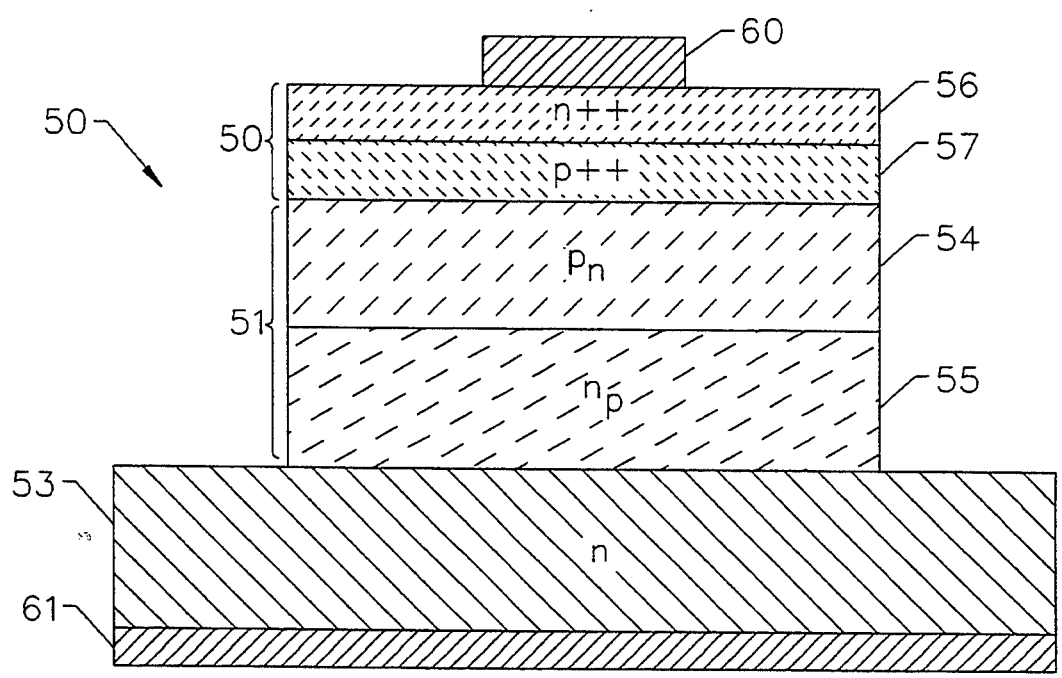
FIG. 3 is a similar view of a third embodiment of the LED of the present invention.

With respect to FIGS. 1–3, it will be understood that the drawings are not made to scale, but are rather schematic and illustrative of the invention. Similarly, the notations $p_n$ and $n_p$ refer to the preferred embodiments in which these layers are both compensated in a manner thoroughly described in previously incorporated U.S. Pat. Nos. 4,918,497 and 5,027,168 to produce desired specific hues of light within the blue portion of the visible spectrum. It will be understood, however, that one or both of the layers could be uncompensated. Furthermore, the relative degree of doping between the compensated p layer and the compensated n layer in all of the light-emitting junction structures described herein can likewise be adjusted to encourage predominant injection of carriers from p to n or n to p as may be most preferred in given circumstances. The invention is perfectly capable of incorporating all of these variations and is not limited to any of them.

Similarly, designations such as "n+," "p+," "n++," or "p++" are not meant to be exact designations, but are intended to indicate a relative degree of doping between adjacent layers with illustrative values for the preferred embodiments being set forth herein.

The structure illustrated in FIG. 1 also includes an additional n-type layer 22 between the light-emitting junction structure 13 and the substrate 11 as well as an additional somewhat more highly doped n-type top layer 23. These layers are optional to the preferred embodiments. The purpose of the layer 22 is to provide a high purity buffer layer atop the substrate prior to growth of the light emitting junction. Stated differently, because high purity epitaxial layers can be easier to grow than substrates of the same purity, adding the buffer layer 22 provides a convenient optional technique for fostering growth of high purity junction layers. It will be understood that such a buffer layer can be optionally included in each of the embodiments claimed and described herein. The $n^{++}$ top layer 23 is employed to encourage current spreading adjacent the ohmic contact of the top layer.

Respective ohmic contacts are shown at 24 and 25 in FIG. 1, and one of the advantages of the invention is that nickel can be used for the ohmic contact to the n-type silicon carbide substrate 11 and the top layer, which could be any one of the layers 12, 21, or 23, depending upon the embodiment. It will be understood that the contacts are likewise illustrated in schematic fashion.

In preferred embodiments, all of the layers are epitaxial layers, although it will be understood that appropriate implantation techniques could produce very similar structures. In preferred embodiments, the layers 20 and 21 in the degenerate junction structure 17 are made thin enough to avoid substantially absorbing light emitted from the light-emitting junction 13. Indeed, one of the disadvantages of p-type silicon carbide is its much lower optical transparency as compared to n-type silicon carbide. Thus, by minimizing the thickness of the p-type layer in the degenerate junction, as well as using only one p-type layer in the light-emitting junction structure, the optical characteristics of the LED, and its resulting brightness, are greatly enhanced.

In every case, the substrate 11 is a single crystal and is preferably selected from the 3C, 4H, 6H, and 15R polytypes of silicon carbide. As is known to those familiar with crystal growth, because the other layers are preferably epitaxial layers, they will be formed of the same polytype as the substrate in most circumstances. As set forth in U.S. Pat. No. 4,912,063, for which the present assignee is the exclusive licensee, there may be situations where one polytype of silicon carbide is preferably formed in an epitaxial layer on another type, and the invention can incorporate these structures as well.

FIG. 2 shows an alternative embodiment of an LED according to the present invention, and broadly designated at 30. FIG. 1 and FIG. 2 differ in that in FIG. 1, the light-emitting junction structure is on the substrate (or on the additional n-type buffer layer on the substrate) with the degenerate junction structure above the light-emitting junction structure. In FIG. 2, in which the degenerate junction structure is designated at 31 and the light-emitting junction structure at 32, the degenerate junction structure is adjacent the substrate and beneath the light-emitting junction structure. Each embodiment has its relative advantages. For example, the structure of FIG. 1 can be processed somewhat easier because the degenerate doping of n-type epitaxial layers of silicon carbide is somewhat easier to control than is the degenerate doping of p-type silicon carbide. The structure illustrated in FIG. 1 allows for the $p^{++}$ layer to be grown prior to the $n^{++}$ layer of junction structure 17 and therefore allows for the doping in the $p^{++}$ layer to stabilize. If the structure of FIG. 2 was produced in a typical processing sequence, however, the growth of the $p^{++}$ layer would follow the growth of the $n^{++}$ layer, and thus the processing may be somewhat more difficult as compared to the manufacture of the device shown in FIG. 1. Alternatively, however, FIG. 2 has the advantage of placing the highly-doped degenerate junction structure 31 underneath the light-emitting junction structure 32. As a result, the highly-doped degenerate junction structure 31 is less likely to substantially absorb light emitted from the light-emitting junction structure 32, even with the minimal thickness previously described for the degenerate junction structure 31.

FIG. 2 similarly illustrates the substrate 33, the individual n-type layer 34 and p-type layer 35 in the light-emitting junction structure 32, the junction 38, the individual p-type layer 36 and n-type layer 37 in the degenerate junction structure, the n-type top layer 40, and the optional second n-type layer 41 on the top layer 40 which, as noted earlier, is useful for current spreading. Ohmic contacts 42 and 43 are likewise made to the device. As set forth earlier, a buffer epitaxial layer between the substrate 33 and the junction structure 31 could also be optionally included if desired.

By way of further potential explanation, and not as a point of limitation, it will be seen that the degenerate junction structure 31 in FIG. 2 and 17 in FIG. 1 basically acts as a resistor coupled to the remainder of the structure and thus avoids two-junction or transistor behavior. Stated differently, and again without limiting the invention, but only by way of proposed explanation, the low resistance degenerate junction structure avoids exhibiting junction barrier behavior, while at the same time remaining thin enough to avoid substantial absorption of light emitted from the device.

A typical substrate has a doping level of between about 4E17 and 2E18, and a thickness of between about 175 and 250 microns. As used herein, the "E" designation is a standard abbreviation of the exponential value of the carrier concentration per cubic centimeter; i.e., 4E17 refers to $4 \times 10^{17}$ cm$^{-3}$. The epitaxial layer 22 shown in FIG. 1 has a doping level of between about 2 and 4E18 and a thickness of about 1 micron. The compensated n layer 14 has a doping level of between about 2 and 7E18 and a thickness of about 3 microns. The compensated p layer 15 has a doping layer of between about 5E17 and 1.5E18 and a thickness of about 6 microns.

The epitaxial layers 20 and 21 in FIG. 1 are preferably very thin; on the order of about 250 to 1000 angstroms (10,000 angsttoms equal one micron) and a very high doping level best expressed as greater than about 1E19. The top layer 12 has a typical thickness of 1 to 10 microns, with a thickness of between about 7 and 9 microns preferred, and a doping level of approximately 1E18. Finally, the top current spreading layer 23 will have a thickness of about 1000 angstroms, and a doping level that is likewise greater than 1E19. The proportions and doping of the embodiment shown in FIG. 2 are similar to those set forth with respect to FIG. 1.

FIG. 3 shows a third embodiment of the invention that eliminates the top n-type layer, instead simply using the top n-type layer of the degenerate junction structure. In FIG. 3, the overall diode is designated at 50, and the light-emitting junction structure is designated at 51, and the degenerate junction structure at 52. As seen therein, the basic structure includes the substrate 53, the respective p-type layer 54 and n-type layer 55 that make up the light-emitting junction structure, and the n-type layer 56 and the p-type layer 57 that make up the degenerate junction structure 52. Ohmic contacts 60 and 61 complete the structure.

In summary, it will thus be seen that the present invention accomplishes better current spreading than existing blue LEDs formed in silicon carbide, but without requiring thick p-type layers to do so. The invention further provides a method for terminating an LED on both sides with n-type silicon carbide (i.e., both top layer and substrate) and yet without producing transistor behavior. The invention thus takes advantage in several respects of the greater conductivity and optical characteristics of n-type silicon carbide. Similarly, because heavily-doped n-type silicon carbide is generally easier to controllably dope than is p-type silicon carbide, the structures herein offer certain processing advantages. Additionally, the structures herein permit nickel to be used for both ohmic contacts, front and back, and nickel is preferred over other types of materials that often must be used to make ohmic contact to p-type silicon carbide.

Because the degenerate junction structure behaves as a resistor matched to the remainder of the structure, the invention avoids two-diode (i.e., transistor) behavior.

The invention can be used in at least two alternative structures, one of which takes advantage of moving the heavily-doped p layer below the light-emitter layers, while the other takes advantage of the easier (typically) processing conditions for n-type silicon carbide.

The invention provides light emitting diodes with a radiant flux of between about 20 and 30 microwatts at a current of 20 microamps. Peak wavelength of the appropriate embodiment is between 470 and 475 nm with a half bandwidth of about 70 nm.

In the drawings and specification there have been set forth preferred and exemplary embodiments, and these are to be understood as descriptive of the invention rather than limiting of it, the scope of the invention being set forth in the following claims.

That which is claimed is:

1. A light emitting diode that emits light in the blue region of the visible spectrum with increased brightness and efficiency; said light emitting diode comprising:
   an n-type silicon carbide substrate;
   an n-type silicon carbide top layer;
   a light emitting p-n junction structure between said n-type substrate and said n-type top layer, said p-n junction being formed of respective portions of n-type silicon carbide and p-type silicon carbide; and
   means between said n-type top layer and said n-type substrate for coupling said n-type top layer to said light-emitting p-n junction structure while preventing n-p-n behavior between said n-type top layer, said p-type portion in said junction structure, and said n-type substrate.

2. A light emitting diode according to claim 1 wherein said coupling means comprises a degenerate junction structure, said degenerate junction structure being formed of a p-type portion and an n-type portion of silicon carbide, with said p-type portion of said degenerate junction structure being adjacent said p-type layer of silicon carbide in said junction structure.

3. A light emitting diode according to claim 2 wherein said doping in said p-type portion and said n-type portion in said degenerate junction structure is sufficiently heavy to substantially eliminate the barrier between the p-type portion and the n-type portion of the silicon carbide from which the portions are formed.

4. A light emitting diode according to claim 2 wherein said degenerate junction structure is on said substrate and said light emitting junction structure is on said degenerate junction structure.

5. A light emitting diode according to claim 2 wherein said light emitting junction structure is on said substrate and said degenerate junction structure is on said light emitting junction structure.

6. A light emitting diode according to claim 1 and further comprising an ohmic contact to said n-type substrate and an ohmic contact to said n-type top layer.

7. A light emitting diode according to claim 2 wherein said n-type portion of silicon carbide and said p-type portion of silicon carbide in said junction structure are each an epitaxial layer.

8. A light emitting diode according to claim 2 wherein said degenerate junction structure comprises an epitaxial layer of p-type silicon carbide and an epitaxial layer of n-type silicon carbide.

9. A light emitting diode according to claim 8 wherein said p-type layer and said n-type layer in said degenerate junction structure are thin enough to substantially avoid absorption of light emitted from said light emitting junction.

10. A light emitting diode according to claim 1 wherein said substrate is a single crystal.

11. A light emitting diode according to claim 10 wherein said substrate has a polytype of silicon carbide selected from the group consisting of 3C, 4H, 6H, and 15R.

12. A light emitting diode according to claim 1 wherein said n-type top layer comprises an epitaxial layer.

13. A light emitting diode that emits light in the blue region of the visible spectrum with increased brightness and efficiency, said light emitting diode comprising:
   an n-type silicon carbide substrate;
   an n-type epitaxial layer of silicon carbide on said n-type substrate;
   a compensated p-type epitaxial layer of silicon carbide on said n-type layer and defining a light emitting p-n junction between said p-type layer and said n-type layer;
   a degenerate junction on said p-type layer, said degenerate junction being formed of a p-type epitaxial layer and an n-type epitaxial layer of silicon carbide, with said p-type portion of said degenerate junction being adjacent said p-type layer of silicon carbide; and
   a second epitaxial layer of n-type silicon carbide on said n-type layer of said degenerate junction.

14. A light emitting diode according to claim 13 wherein said n-type epitaxial layer on said substrate is a compensated n-type layer.

15. A light emitting diode according to claim 14 wherein said compensated n-type epitaxial layer has a carrier concentration greater than said compensated p-type layer so that electron injection predominates across said junction.

16. A light emitting diode according to claim 13 and further comprising an ohmic contact to said second epitaxial layer of n-type silicon carbide.

17. A light emitting diode according to claim 16 wherein said ohmic contact comprises nickel.

18. A light emitting diode according to claim 13 and further comprising a third epitaxial layer of n-type silicon carbide on said second epitaxial layer, said third layer being more heavily doped than said second layer.

19. A light emitting diode according to claim 18 and further comprising an ohmic contact to said third epitaxial layer of n-type silicon carbide.

20. A light emitting diode according to claim 19 wherein said ohmic contact comprises nickel.

21. A light emitting diode according to claim 13 and further comprising an ohmic contact to said n-type substrate.

22. A light emitting diode according to claim 21 wherein said ohmic contact comprises nickel.

23. A light emitting diode according to claim 13 and further comprising a fourth epitaxial buffer layer of n-type silicon carbide between said substrate and said light emitting junction structure.

24. A light emitting diode according to claim 13 wherein said doping in said p-type layer and said n-type layer in said degenerate junction is sufficiently heavy to substantially eliminate the barrier between the p-type layer and the n-type layer to be greater than the bandgap of the silicon carbide from which said layers are formed.

25. A light emitting diode according to claim 13 wherein said p-type layer and said n-type layer in said degenerate junction are thin enough to substantially avoid absorption of light emitted from said light emitting junction.

26. A light emitting diode according to claim 13 wherein said substrate is a single crystal.

27. A light emitting diode according to claim 26 wherein said substrate has a polytype of silicon carbide selected from the group consisting of 3C, 4H, 6H, and 15R.

28. A light emitting diode that emits light in the blue region of the visible spectrum with increased brightness and efficiency, said light emitting diode comprising:
an n-type silicon carbide substrate;
a degenerate junction on said n-type substrate, said degenerate junction diode being formed of a p-type epitaxial layer and an n-type epitaxial layer of silicon carbide, with said n-type layer of said degenerate junction being adjacent said n-type substrate;
a compensated p-type epitaxial layer of silicon carbide on said p-type layer of said degenerate junction;
an n-type epitaxial layer of silicon carbide on said compensated p-type epitaxial layer, and defining a light emitting p-n junction between said p-type layer and said n-type layer; and
a second epitaxial layer of n-type silicon carbide on said compensated n-type layer.

29. A light emitting diode according to claim 28 wherein said n-type epitaxial layer on said substrate is a compensated n-type layer.

30. A light emitting diode according to claim 29 wherein said compensated n-type epitaxial layer has a carrier concentration greater than said compensated p-type layer so that electron injection predominates across said junction.

31. A light emitting diode according to claim 28 and further comprising an ohmic contact to said second epitaxial layer of n-type silicon carbide.

32. A light emitting diode according to claim 31 wherein said ohmic contact comprises nickel.

33. A light emitting diode according to claim 28 and further comprising a third epitaxial layer of n-type silicon carbide on said second epitaxial layer, said third layer being more heavily doped than said second layer.

34. A light emitting diode according to claim 33 and further comprising an ohmic contact to said third epitaxial layer of n-type silicon carbide.

35. A light emitting diode according to claim 34 wherein said ohmic contact comprises nickel.

36. A light emitting diode according to claim 28 and further comprising an ohmic contact to said n-type substrate.

37. A light emitting diode according to claim 36 wherein said ohmic contact comprises nickel.

38. A light emitting diode according to claim 28 wherein said doping in said p-type layer and said n-type layer in said degenerate junction is sufficiently heavy to substantially eliminate the barrier between the p-type layer and the n-type layer to be greater than the bandgap of the silicon carbide from which said layers are formed.

39. A light emitting diode according to claim 28 wherein said p-type layer and said n-type layer in said degenerate junction are thin enough to substantially avoid absorption of light emitted from said light emitting junction.

40. A light emitting diode according to claim 28 wherein said substrate is a single crystal.

41. A light emitting diode according to claim 40 wherein said substrate has a polytype of silicon carbide selected from the group consisting of 3C, 4H, 6H, and 15R.

42. A light emitting diode that emits light in the blue region of the visible spectrum with increased brightness and efficiency, said light emitting diode comprising:
an n-type silicon carbide substrate;
an n-type layer of silicon carbide on said n-type substrate;
a p-type layer of silicon carbide on said n-type layer and defining a light emitting p-n junction between said p-type layer and said n-type layer; and
a degenerate junction on said p-type layer, said degenerate junction being formed of a p-type portion and an n-type portion of silicon carbide, with said p-type portion of said degenerate junction being adjacent said p-type layer of silicon carbide.

43. A light emitting diode according to claim 42 wherein said doping in said p-type portion and said n-type portion in said degenerate junction is sufficiently heavy to substantially eliminate the barrier between the p-type portion and the n-type portion of the silicon carbide from which the portions are formed.

44. A light emitting diode according to claim 42 and further comprising an ohmic contact to said n-type substrate and an ohmic contact to said n-type portion in said degenerate junction.

45. A light emitting diode according to claim 42 wherein said p-type layer and said n-type layer in said degenerate junction are thin enough to substantially avoid absorption of light emitted from said light emitting junction.

46. A light emitting diode according to claim 42 wherein said substrate is a single crystal.

47. A light emitting diode according to claim 46 wherein said substrate has a polytype of silicon carbide selected from the group consisting of 3C, 4H, 6H, and 15R.

* * * * *

UNITED STATES PATENT AND TRADEMARK OFFICE
CERTIFICATE OF CORRECTION

PATENT NO. : 5,338,944
DATED : August 16, 1994
INVENTOR(S) : Edmond et al.

It is certified that error appears in the above-identified patent and that said Letters Patent is hereby corrected as shown below:

In Column 1, line 61, "(GAN)" should be --(GaN)--.

In Column 4, line 12, after "structure" insert -- 13.--.

In Column 6, line 39, "$cm^{31\ 3}$" should be -- $cm^{-3}$ --.

In Column 6, line 49, "angsttoms" should be -- angstroms --.

Signed and Sealed this

Sixth Day of December, 1994

Attest:

BRUCE LEHMAN

Attesting Officer

Commissioner of Patents and Trademarks